United States Patent [19]

Chang et al.

[11] Patent Number: 4,467,344
[45] Date of Patent: Aug. 21, 1984

[54] BIDIRECTIONAL SWITCH USING TWO GATED DIODE SWITCHES IN A SINGLE DIELECTRICALLY ISOLATED TUB

[75] Inventors: Gee-Kung Chang; Adrian R. Hartman, both of New Providence; Harry T. Weston, Berkeley Heights, all of N.J.

[73] Assignee: AT&T Bell Telephone Laboratories, Incorporated, Murray Hill, N.J.

[21] Appl. No.: 333,700

[22] Filed: Dec. 23, 1981

[51] Int. Cl.³ .................. H01L 29/747; H01L 29/74; H01L 29/06

[52] U.S. Cl. ...................................... 357/39; 357/38; 357/55

[58] Field of Search .............. 357/39, 38, 39 A, 39 C, 357/39 E, 39 L, 39 P, 39 T, 39 R, 38 C, 38 E, 38 L, 38 P, 38 R, 38 T, 55

[56] References Cited

U.S. PATENT DOCUMENTS

| | | | |
|---|---|---|---|
| 4,130,827 | 12/1978 | D'Altroy et al. | 357/38 |
| 4,170,020 | 10/1979 | Sueoka et al. | 357/55 X |
| 4,371,886 | 2/1983 | Hartman et al. | 357/38 |
| 4,371,887 | 2/1983 | Hartman et al. | 357/38 |

Primary Examiner—Martin H. Edlow
Assistant Examiner—William A. Mintel
Attorney, Agent, or Firm—Irwin Ostroff

[57] ABSTRACT

A semiconductor structure contains two interconnected gated diode switches in a common dielectrically isolated semiconductor tub. This structure functions as a bidirectional switch. A gate region physically located between the two switches provides electrical isolation to allow proper operation.

18 Claims, 3 Drawing Figures

BIDIRECTIONAL SWITCH USING TWO GATED DIODE SWITCHES IN A SINGLE DIELECTRICALLY ISOLATED TUB

TECHNICAL FIELD

This invention relates to solid-state structurees and, in particular, to high voltage bidirectional solid-state structures useful in telephone switching systems and many other applications.

BACKGROUND OF THE INVENTION

In the article entitled "A 500 V Monolithic Bidirectional 2×2 Crosspoint Array", 1980 *IEEE International Solid-State Circuits Conference-Digest of Technical Papers,* pages 170 and 171, there is described a dielectrically isolated gated diode switch (GDS). Two separate such switches in a common substrate, with each contained in a separate dielectrically isolated tub, are illustrated coupled in an anti-parallel configuration with the gates being common and the anode of each coupled to the cathode of the other. Such a configuration functions as a bidirectional switch which can pass current in both directions.

It is desirable to have a solid-state bidirectional switch comprising two gated diode switches (GDS's) in a single dielectrically isolated tub that requires less silicon area than the above described two GDS's in separate dielectrically isolated tubs.

SUMMARY OF THE INVENTION

The present invention is directed to an all solid-state bidirectional switch which essentially comprises two gated diode switches in a single dielectrically isolated semiconductor body (tub) of a first conductivity type. A semiconductor substrate is separated from the semiconductor body by a first insulator layer which is typically silicon dioxide. On one side of the tub is a first anode region of the first conductivity type and a first cathode region of the opposite conductivity type. On the other side of the tub is a second anode region of the first conductivity type and a second cathode region of the opposite conductivity type. Between the first anode and cathode regions and the second anode and cathode regions is a gate region of the opposite conductivity type which acts to electrically isolate the first anode and cathode regions from the second anode and cathode regions and to provide proper operation. All anode and cathode regions are separated by portions of the bulk of the semiconductor body and all have low resistivity compared to the bulk of the semiconductor body. A first electrode is coupled to the first anode region and to the second cathode region; a second electrode is coupled to the second anode region and to the first cathode region; and a third electrode is coupled to the gate region. The semiconductor body has a top surface which is a part of a major top surface of the semiconductor substrate and has a major bottom surface. The gate region can optionally be extended so as to pass between both sets of anode and cathode regions on the major top surface or on the major bottom surface or on both surfaces.

The use of the common gate region to provide electrical isolation between two gated diode switches in a common dielectrically isolated tub results in a net savings of silicon area compared to two separate dielectrically isolated tubs each of which contains a gated diode switch. This silicon area savings can significantly lower fabrication costs of arrays of switches.

These and other novel features and advantages of the present invention are better understood from consideration of the following detailed description taken in conjunction with the accompanying drawings.

BRIEF DESCRIPTION OF THE DRAWINGS

FIG. 3 illustrates a portion of an approximate electrical equivalent circuit of the structure of FIG. 1 with same being biased to allow conduction there through.

DETAILED DESCRIPTION

Figure 1:
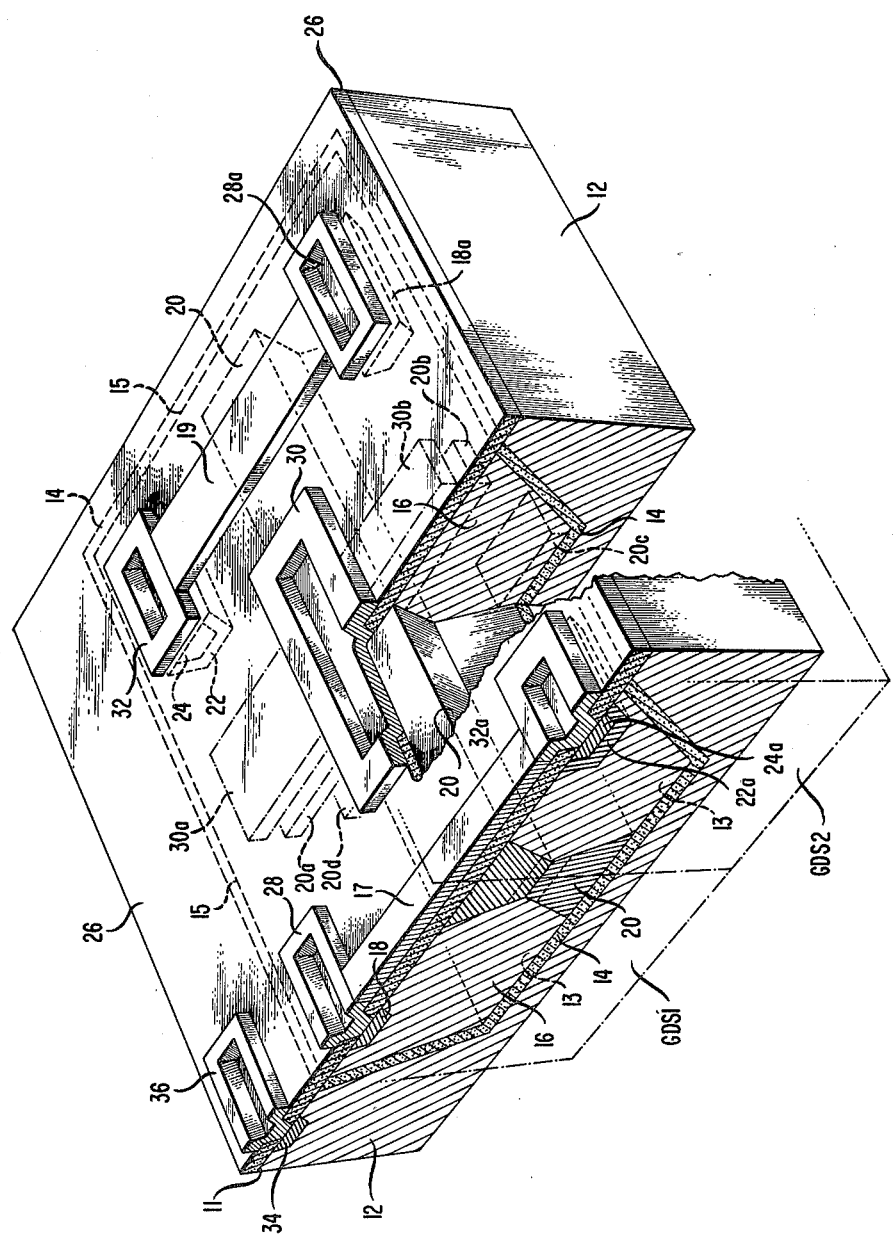
FIG. 1 illustrates a structure in accordance with one embodiment of the invention.
Figure 2:
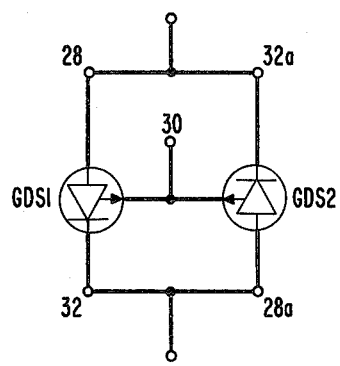
FIG. 2 illustrates an approximate electrical schematic of the structure of FIG. 1.

Referring now to FIG. 1, there is illustrated a structure 10 which can be used as a bidirectional solid-state switch that permits conduction there through in both directions and is capable of at least limited current break (interrupt) operation. Structure 10 essentially comprises two interconnected gated diode switches GDS1 and GDS2 coupled together in an anti-parallel configuration as is illustrated in electrical schematic form in FIG. 2. The configuration of FIG. 2 is illustrated on page 171 of the article in the 1980 IEEE publication described in the Background of the Invention of this application.

The basic portions of structure 10 which essentially comprise GDS1 and GDS2 are illustrated within the appropriate labeled dashed lines. The basic explanation of the operation of a gated diode switch is described in the article in the 1980 IEEE publication described herein above and in copending U.S. patent application Ser. No. 248,192, filed Mar. 27, 1980 and having one common inventor and a common assignee with the present application. Accordingly, the reader will be assumed to be familiar with the basic operation of a gated diode switch.

Structure 10 comprises a support member 12 having a major top surface 11 and a semiconductor body 16 of a first conductivity type which is separated from member 12 by a first dielectric layer 14. Semiconductor body 16 has a portion which is common with major top surface 11 and has a major bottom surface 13 and four side walls 15 of which only the front is not illustrated. A second apertured dielectric layer 26 covers top surface 11. A localized contact region 34 has a portion which is common with major top surface 11.

Localized first and second anode regions 18 and 18a, which are of the one conductivity type, and localized first and second cathode regions 24 and 24a, which are of the opposite conductivity type, are included in semiconductor body 16. A localized first shield region 22, which is of the one conductivity type, surrounds region 24 and a second shield region 22a, which is of the one conductivity type, surrounds region 24a. A localized gate junction isolation region 20, which is of the opposite conductivity type, is also included in semiconductor body 16. Region 20 typically has a top portion which extends down from surface 11 and contacts the top of a bottom portion thereof which extends upward from major bottom surface 13. Region 20 extends across the top of semiconductor body 16 and vertically downward so as to physically divide semiconductor body 16 into two separate portions. As is indicated by the dashed lines, the upper and lower portions of gate region 20 need not always actually contact each other and region 20 need not always extend completely across semiconductor body 16. The portion of semiconductor body 16 to the left of region 20 contains first anode region 18 and first cathode region 24 and the portion of semiconductor body 16 to the right of region 20 contains second anode region 18a and second cathode region 24a.

Electrodes 28, 32, 28a, 32a, 30, and 36 contact regions 18, 24, 18a, 24a, 20, and 34, respectively.

Electrode 30 is illustrated having a first portion 30a (illustrated by dashed lines) which extends between first anode region 18 and first cathode region 24 and a second portion 30b (illustrated by dashed lines) which extends between second cathode region 24a and second anode region 18a. Region 20 is also illustrated having: (1) a first semiconductor portion 20a (illustrated by dashed lines) extending along surface 11 and extending downward into body 16 and existing between regions 18 and 24, (2) a second semiconductor portion 20b (illustrated by dashed lines) extending along surface 11 and extending downward into body 16 and existing between regions 18a and 24a, (3) a third semiconductor portion 20c (illustrated by dashed lines) extending along surface 13 and extending upward into body 16 and existing vertically below and between regions 24a and 18a, and (4) a fourth semiconductor portion 20d (illustrated by dashed lines) extending along surface 13 and extending upward into body 16 and existing vertically below and between regions 24 and 18. The various illustrated dashed line configurations of gate region 20 are optional and are descirbed in one of the copending U.S. patent application Ser. No. 248,192, which was filed Mar. 27, 1981, and has one common inventor and a common assignee with the present application, and copending U.S. patent application Ser. No. 333,762 (A. R. Hartman-A. U. Mac Rae-P. W. Shackle 32-23-37), which is being filed concurrently with the present application, and in which there is one common inventor and a common assignee.

A first conductor 17 connects first anode electrode 28 with second cathode electrode 32a. A second conductor 19 connects second anode electrode 28a to first cathode electrode 32. Electrodes 28 and 32a serve as a first output terminal of structure 10, electrodes 32 and 28a serve as a second output terminal of structure 10, and electrode 30 serves as a control (gate) terminal of structure 10.

Support member 12 is typically a semiconductor substrate and region 34 is a contact region that is of the same conductivity type as substrate 12, but of lower resistivity. In a preferred embodiment, semiconductor substrate 12, region 34, semiconductor body 16, regions 18, 18a, 20, 22, 22a, 24 and 24a are of n, n+, p−, p+, p+, n+, p, p, n+, and n+ type conductivity, respectivity. All electrodes and conductors are typically aluminum and the dielectric layers are typically silicon dioxide and/or composite layers of silicon dioxide and silicon nitride. The n+ and p+ type conductivity regions would have a surface impurity concentration of approximately $10^{19}$ impurities/cm$^3$. The p− type semiconductor body 16 would have an impurity concentration of approximately $9 \times 10^{13}$ impurities/cm$^3$ and the substrate 12 would have an impurity concentration of approximately $10^{12}$ to $10^{16}$ impurities/cm$^3$. The p type regions would have a surface impurity concentration of approximately $10^{18}$ impurities/cm$^3$. In a typical embodiment semiconductor body 16 has a thickness of 50–60 microns and the surface 11 portion thereof is 300 by 500 microns. For 500 to 600 volt operation, the typical spacing between upper and lower portions of region 20 is 10 microns and the spacing between an end of region 20 and the sidewall 15 of semiconductor body 16 is 5 microns.

Decreasing the impurity concentration of semiconductor body 16 from $9 \times 10^{13}$ impurities/cm$^3$ to approximately $1 \times 10^{13}$ impurities/cm$^3$ causes a change in the operation of GDS1 and GDS2. This type of operation of a gated diode switch is disclosed in U.S. patent application Ser. No. 333,762 (A. R. Hartman-A. U. Mac Rae-P. W. Shackle 32-23-37) which is being filed concurrently with the present application and in which there is one common inventor and a common assignee. This same type of operation can be achieved with greater reproducibility if a first resistive type region is added between anode region 18 and region 22 and a second resistive type region is added between anode region 18a and region 22a.

If region 20 extends from surface 11 down to surface 13 and from rear wall 15 completely across semiconductor body 16 to front wall 15, the semiconductor body 16 is physically divided into two separate portions which are essentially electrically isolated from each other by a high voltage, relatively low leakage p-n junction. This results in an effective high resistance between the two separated portions of semiconductor body 16 which limits current from flowing directly from one portion to the other portion through region 20. This permits each of GDS1 and GDS2 to operate relatively independent of the other.

If the top and bottom portions of region 20 do not meet to form one solid region and/or do not extend completely from rear side wall 15 to front side wall 15, then semiconductor body 16 is not completely physically divided into two portions but is essentially electrically isolated into two portions, each of which contains a gated diode switch. The top and bottom portions of region 20 act as the gates of a high voltage junction field effect transistor (a JFET) with the portions of semiconductor body 16 between the upper and lower portions of region 20 and between the portions of region 20 and the side walls 15 of dielectric layer 14 being essentially pinched off so as to have a much higher resistance than other portions of the bulk portion of semiconductor body 16. This serves to essentially electrically isolate semiconductor body 16 into a first portion containing a first gated diode switch (GDS1) which comprises essentially regions 18, 22, and 24 and region 20 and into a second portion containing a second gated diode switch (GDS2) which comprises essentially regiond 18a, 22a, and 24a and region 20. GDS1 and GDS2 are capable of operating essentially independently of each other.

Sufficient electrical isolation between GDS1 and GDS2 is required in order to avoid the need for an excessive turn on voltage, to assure proper device turn on, and to facilitate relatively low on resistance.

FIG. 2 illustrates a bilateral switch combination in which first anode electrode 28 and second cathode electrode 32a comprise the first output terminal, second anode electrode 28a and first cathode electrode 32 comprise the second output terminal, and gate junction isolation electrode 30 comprises the control (gate) terminal. This combination is capable of conducting signals from electrodes 28 and 32a to electrodes 28a and 32 or vice versa.

Figure 3:
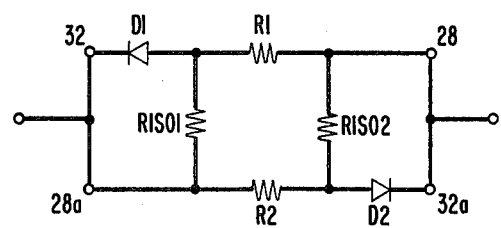

Referring now to FIG. 3, there is illustrated an approximate equivalent electrical schematic of the semiconductor structure 10 of FIG. 1 assuming gate region 20 is biased to allow conduction through structure 10. R1 represents the resistance from first anode region 18 through the bulk portion of semiconductor body 16 between first anode region 18 and shield region 22. The diode D1 illustrated coupled by the cathode terminal thereof to electrode 32 represents the p-n junction between shield region 22 and cathode region 24. RISO1 represents the effective resistance between shield region 22 and anode region 18a through the bulk portion of semiconductor body 16 separating regions 22 and 20, through gate region 20, and through the bulk portion of semiconductor body 16 separating regions 20 and 18a. R2 represents the resistance from second anode region 18a through the bulk portion of semiconductor body 16 between second anode region 18a and shield region 22a. The diode D2 illustrated coupled by the cathode terminal thereof to the electrode 32a represents the p-n junction between shield region 22a and cathode region 24a. RISO2 represents the effective resistance between shield region 22a and anode 18 through the bulk portion of semiconductor body 16 separating regions 22a and 20, through gate region 20, and through the bulk portion of semiconductor body 16 separating regions 20 and 18.

R1 and R2 are typically lower resistances than RISO1 and RISO2. In one typical embodiment, prior to the on set of conductivity modulation within semiconductor body 16, R1 and R2 are typically 35,000 ohms. RISO1 and RISO2 are typically 100,000 ohms or greater. As one of the gated diode switches starts to turn on, the conductivity modulation within semiconductor body 16 significantly lowers the value of R1 or R2 to typically 20 ohms or less and reduces the value of RISO1 and RISO2, but by a much lesser amount. If electrodes 28 and 32a are positively biased with respect to electrodes 28a and 32 (typically by approximately +2 volts or more), and gate electrode 30 (not illustrated in FIG. 3) is biased to allow conduction through structure 10, then current flows from electrodes 28 and 32a through R1 and then through diode D1, and into electrodes 32 and 28a. Only a relatively small amount of current flows through RISO1 and RISO2 since both have relatively large resistance compared to the forward biased resistance of D1. Diode D2 is reversed biased and therefore essentially no current flows through D2. If, conversely, electrodes 28a and 32 are positively biased with respect to electrodes 28 and 32a, and gate electrode 30 (not illustrated in FIG. 3) is biased to allow conduction through structure 10, then current flows from electrodes 28a and 32 through R2 and then through diode D2 and into electrodes 32a and 28. Only a relatively small amount of current flows through RISO2 and RISO1 since both have relatively large resistance compared to the forward biased resistance of D2. Diode D1 is reverse biased and essentially no current flows through D1.

Structure 10 has thus been shown to be capable of being used as a bidirectional switch with little leakage between junction isolated gated diode switches GSD1 and GDS2. Structure 10 replaces two gated diode switches which are each in a separate dielectrically isolated tub with two gated diode switches in a single dielectrically isolated tub. It can be fabricated in significantly less silicon area and therefore provides a significant reduction in costs.

The embodiments described herein are intended to be illustrative of the general principals of the invention. Various modifications are possible consistent with the spirit of the invention. For example, for the designs described, support member 12 can be p, p— or n— type conductivity silicon, gallium arsenide, sapphire, or an electrically inactive material. If support member 12 is an electrically inactive material, then dielectric layer 14 can be eliminated. Still further, body 16 can be fabricated as an air-isolated structure. This allows for the elimination of support member 12 and dielectric layer 14. Further, the electrodes can be doped polysilicon, gold, titanium, or other types of conductors. Still further, the impurity concentration levels, spacings between different regions, and other dimensions of the regions can be adjusted to vary the operating voltages and currents. Additionally, other types of insulator (dielectric) materials, such as silicon nitride or semiinsulating polycrystalline oxygen doped silicon (SIPOS) can be substituted for silicon dioxide. Still further, the conductivity type of all regions can be reversed provided the voltage polarities are appropriately changed in the manner well known in the art. Still further, the semiconductor region 22 (22a) which surrounds the cathode region 24 (24a) can be modified to also include a guard ring region and other surrounding region(s) of increasing resistivity. Additional regions of increasing resistivity may surround anode region 18 (18a). A guard ring and surrounding regions are illustrated in copending U.S. patent application Ser. No. 248,192. Still further, region 20 can be of n— or n type conductivity. Still further, a single semiconductor substrate can contain some semiconductor bodies which are of p— type conductivity and others which are of n— type conductivity. Still further, portions 20a, 20b, 20c, and/or 20d of region 20 can be n or n— type conductivity and not necessarily of the same impurity level as each other or as region 20. Still further, conductors 17 and 19 can be routed around region 20 and outside dielectric layer 14.

What is claimed is:

1. A semiconductor structure comprising:
   a semiconductor body whose bulk is of one conductivity type and which has a major top surface;
   first and second separate localized regions of the one conductivity type;
   third and fourth separate localized regions which are of the opposite conductivity type of the bulk portion of the semiconductor body;
   the first, second, third, and fourth regions being of relatively low resistivity as compared to the bulk portion of the semiconductor body, being separated from each other by portions of the bulk of the semiconductor body, and each having a portion thereof that forms a part of the major top surface of the semiconductor body;
   a first electrode being coupled to the first and fourth regions;
   a second electrode being coupled to the second and third regions;
   a localized fifth region of the opposite conductivity type of the bulk of the semiconductor body and located with the first and third regions on one side thereof and with the second and fourth regions on the other side thereof such that the first and third regions are essentially electrically isolated from the second and fourth regions; and
   a third electrode being coupled to the fifth region.

2. The semiconductor structure of claim 1 further comprising:

sixth and seventh localized regions of the same conductivity type as the bulk portions of the semiconductor body but of higher impurity concentration;

the sixth region surrounds the third region so as to separate same from the bulk portion of the semiconductor body; and the seventh region surrounds the fourth region so as to separate same from the bulk portion of the semiconductor body.

3. The semiconductor structure of claim 2 further comprising:
a semiconductor support member (substrate);
a first insulator layer; and
the semiconductor body being separated from the semiconductor substrate by the first insulator layer.

4. The semiconductor structure of claim 3 wherein the fifth region is located in portions of top major surface of the semiconductor body other than the portions which directly separate the first and third regions and directly separate the second and fourth regions.

5. The semiconductor structure of claim 3 wherein the fifth region has portions on the major top surface which are located in portions of the semiconductor body which are between the first and third regions and between the second and fourth regions.

6. The semiconductor structure of claim 5 wherein the semiconductor body has a major bottom surface and the fifth region also has portions on the major bottom surface which are located in portions of the semiconductor body which are below and between the first and third regions and below and between the second and fourth regions.

7. The semiconductor structure of claim 3 where the semiconductor body has a major bottom surface and the fifth region also has portions thereof on the major bottom surface which are located in portions of the semiconductor body which are below and between the first and third regions and below and between the second and fourth regions.

8. The semiconductor structure of claim 7 further comprising:
a second apertured insulating layer existing on top of the major surface of the semiconductor body;
the electrode coupled to the fifth region has portions thereof which extend over the second insulating layer and are located above and between the first and third regions and above and between the second and fourth regions;
a first electrical conductor which contacts the frst and fourth regions and partly extends over the top of the second insulating layer; and
a second electrical conductor which contacts the second and third regions and partly extends over the top of the second insulating layer.

9. The semiconductor structure of claim 3 wherein the semiconductor body, the first, second, third, fourth, fifth, sixth and seventh regions are of p−, p+, p+, n+, n+, n+, p, and p type conductivity, respectively.

10. The semiconductor structure of claim 3 wherein the semiconductor body, the first, second, third, fourth, fifth, sixth, and seventh regions are of n−, n+, n+, p+, p+, p+, n, and n type conductivity, respectively.

11. The semiconductor structure of claim 3 or claim 4 or claim 5 or claim 6 or claim 7 or claim 8 or claim 9 or claim 10 wherein:
the semiconductor structure is adapted to selectively facilitate current flow between the first and third regions or between the second and fourth regions or to divert a sufficient portion of said current into the fifth region so as to interrupt (cut off) said current flow between the first and third regions or between the second and fourth regions; and
the semiconductor structure is also adapted to selectively substantially inhibit current from flowing between the first and third regions and between the second and fourth regions.

12. A semiconductor structure comprising:
a semiconductor body whose bulk is of one conductivity type and which has a major top surface and a major bottom surface, and side walls;
a semiconductor support member (substrate);
a first insulator layer;
the semiconductor body being separated from the semiconductor substrate by the first insulator layer;
first and second separate localized regions which are of the one conductivity type;
third and fourth separate localized regions which are of the opposite conductivity type of the bulk portion of the semiconductor body;
the first, second, third and fourth regions being of relatively low resistivity as compared to the bulk portion of the semiconductor body, being separated from each other by portions of the semiconductor body and, each having a portion thereof that forms a part of the major surface of the semiconductor body;
a first electrode being coupled to the first and fourth regions;
a second electrode being coupled to the second and third regions;
a localized fifth region of the opposite conductivity type of the bulk portion of the semiconductor body;
the fifth region extends from the major bottom surface upward into the semiconductor body and is located so as to separate the first and third regions from the second and fourth regions and being located between and below the first and third regions and between and below the second and fourth regions;
a localized sixth region being selectively located above the fifth region and being of the same conductivity type as the fifth region and extending from the major top surface of the semiconductor body downward into the semiconductor body so as to separate the first and third regions from the second and fourth regions;
a third electrode being coupled to the sixth region; and
the fifth and sixth regions being located such that they are separated from the first, second, third and fourth regions by portions of the bulk of the semiconductor body and such that they electrically isolate the first and third regions from the second and fourth regions.

13. The semiconductor structure of claim 12 wherein portions of the fifth and sixth regions physically contact each other so as to physically divide the semiconductor body into two parts.

14. The semiconductor structure of claim 13 further comprising:
a second apertured insulator layer which is located on the top major surface of the semiconductor body;
the third electrode extends over the second insulator layer so as to at least partly cover the fifth region which exists there below;

a first electrical conductor which contacts the first and fourth regions and partly extends over the top of the second insulating layer; and a second electrical conductor which contacts the second and third regions and partly extends over the top of the second insulating layer.

15. The semiconductor structure of claim 14 further comprising:

seventh and eighth localized regions of the same conductivity type as the bulk portions of the semiconductor body but of higher impurity concentration;

the seventh region surrounds the third region so as to separate same from the bulk portion of the semiconductor body; and the eighth region surrounds the fourth region so as to separate same from the bulk portion of the semiconductor body.

16. The semiconductor structure of claim 15 wherein:

the semiconductor structure is adapted to selectively facilitate current flow between the first and third regions or between the second and fourth regions or to divert a sufficient portion of said current into the fifth and sixth regions so as to interrupt (cut off) said current flow between the first and third regions or between the second and fourth regions; and the semiconductor structure is also adapted to selectively substantially inhibit current from flowing between the first and third regions and between the second and fourth regions.

17. The semiconductor structure of claim 15 or claim 16 wherein the semiconductor body, the first, second, third, fourth, fifth, sixth, seventh, and eighth regions are of p−, p+, p+, n+, n+, n+, n+, p, and p type conductivity, respectively.

18. The semiconductor structure of claim 15 or claim 16 wherein the semiconductor body, the first, second, third, fourth, fifth, sixth, seventh and eighth regions are of n−, n+, n+, p+, p+, p+, p+, n and n type conductivity, respectively.

* * * * *